United States Patent [19]
Chan

[11] Patent Number: 5,515,006
[45] Date of Patent: May 7, 1996

[54] LOW DISTORTION EFFICIENT LARGE SWING CMOS AMPLIFIER OUTPUT

[75] Inventor: Shufan Chan, Anaheim Hills, Calif.

[73] Assignee: Linfinity Microelectronics, Inc., Garden Grove, Calif.

[21] Appl. No.: 399,504

[22] Filed: Mar. 7, 1995

[51] Int. Cl.[6] .................................................. H03F 3/26
[52] U.S. Cl. .......................................... 330/255; 330/264
[58] Field of Search .................................. 330/253, 255, 330/264, 265, 267

[56] References Cited

PUBLICATIONS

Linfinity Microelectronics, Production Data Sheet SG55236, Dual Sense Amplifier/Data Registers Rev. 1.1 Apr. 1990.

*Primary Examiner*—Steven J. Mottola
*Attorney, Agent, or Firm*—Loeb & Loeb

[57] ABSTRACT

An improved output stage for a CMOS circuit is disclosed. In particular, the circuit drives both output transistors of a push-pull output in class AB operation for efficient power usage with low noise and distortion with a minimal number of components.

17 Claims, 3 Drawing Sheets

5,515,006

LOW DISTORTION EFFICIENT LARGE SWING CMOS AMPLIFIER OUTPUT

BACKGROUND OF THE INVENTION

1. Field of the Invention

This invention relates to amplifiers and more particularly decreasing the power consumption of CMOS amplifiers.

2. Description of the Prior Art

CMOS circuitry is generally used where lower power consumption is desired such as in battery operated electronic components. However, the output stage of CMOS analog amplifiers are relatively inefficient.

These inefficiencies can be demonstrated by reference to FIG. 1, which is a typical two stage CMOS amplifier 10. The input stage 12 comprises differentially coupled P channel transistors MP1 and MP2 having their sources coupled to a current source, I1. The output is taken through an active load MN2 at the drain of one of the input transistors MP2 and coupled to drive the output stage.

The output stage 14 comprises a P channel transistor MP3 and an N channel transistor MN3, coupled in a source/sink configuration, compensation capacitor Cc and current source 12. Of all the components provided for in the output stage 14, only transistor MN3 is driven by the input stage 12. Hence, output stage source transistor MP4 must always be conducting a large amount of current. That current is determined by a current source 12. For the output stage to provide wide voltage swings and for the output to be able to source or sink relatively large amounts of current, the current through transistor MP4 must be large. However, when the input signal is quiescent, transistor MP4 will conduct the same current that it will conduct when the load is sinking a large amount of current. Further, it should be noted that in this implementation of an amplifier 10, transistor MP4 does not switch, irrespective of the input signal. Thus transistor MP4 is inefficient.

There have been a number of articles describing attempts to lower the power consumption of the output stage of CMOS amplifiers. These include J. A. Fisher, "A High Performance CMOS Power Amplifier", Institute of Electrical and Electronic Engineers (IEEE) Journal of Solid State Circuits (JSSC) Vol. SC-20, December, 1985; S. L. Wong and C. A. T. Salama, "An Efficient CMOS Buffer for Driving Large Capacitive Loads", IEEE JSSC vol. SC-21, June 1986; and F. N. L. Op't Eynde, P. F. M. Ampe, L. Verdeyen and W. M. C. Sansen, "A CMOS Large-Swing Low Distortion Three Stage Class AB Power Amplifier, IEEE JSSC vol. SC-25 February, 1990. Although these articles propose circuits that, with various degrees of success, provide a methodology for reducing power consumption, they generally increase the complexity of the circuit, require more transistors and thereby require a larger die size. Improved efficiency for the output stage typically results in distortion, and increased circuit complexity often creates noise.

SUMMARY OF THE INVENTION

Therefore, it is a first object of the invention to provide a more efficient output stage for an amplifier. It is a second object of the invention to provide such an output stage without increasing the signal to noise ratio of the amplifier and to permit a large (relative to the power supply) voltage swing. It is yet another object to permit the output stage to source or sink a large amount of current. It is still yet another object of this invention to provide a low quiescent current that is predictable.

These and other objects are obtained by the disclosed embodiment of the invention. The input stage of the amplifier may remain the same and the output stage includes a pair of complementary output transistors, one of which is driven directly by the input stage. The other output transistor, the indirectly driven transistor in the output stage, has its gate coupled to another transistor that has its drain coupled to the source of a second transistor driven directly by the output of the input stage. The source of this second transistor that is driven directly by the input stage is also coupled to the noninverting input of an internal biasing amplifier. The other, inverting input of the amplifier is coupled to a current source and one or more saturated diodes that establish the quiescent current of the indirectly driven output transistor.

Preferably, the quiescent current is set so the amplifier is a class AB amplifier and provides a much more efficient output stage. The second transistor, now indirectly driven by the output of the input stage may have its quiescent current set to a minimal value. Therefore, rather than in the typical prior art CMOS amplifier where the quiescent current of the second transistor of the output stage is conducting a relatively large amount of irrespective of the input signal, quiescent current is dramatically reduced. Nonetheless, when the load needs to sink or source a large amount of current, this indirectly driven output transistor can provide a large amount of current.

Further, with this circuitry it is possible to attain an output that may take large excursions relative to the power supply. Given that the circuitry is a class AB amplifier, the output of the circuit can provide a low signal to noise ratio with minimal distortion also.

DETAILED DESCRIPTION OF THE DRAWINGS

Figure 1:
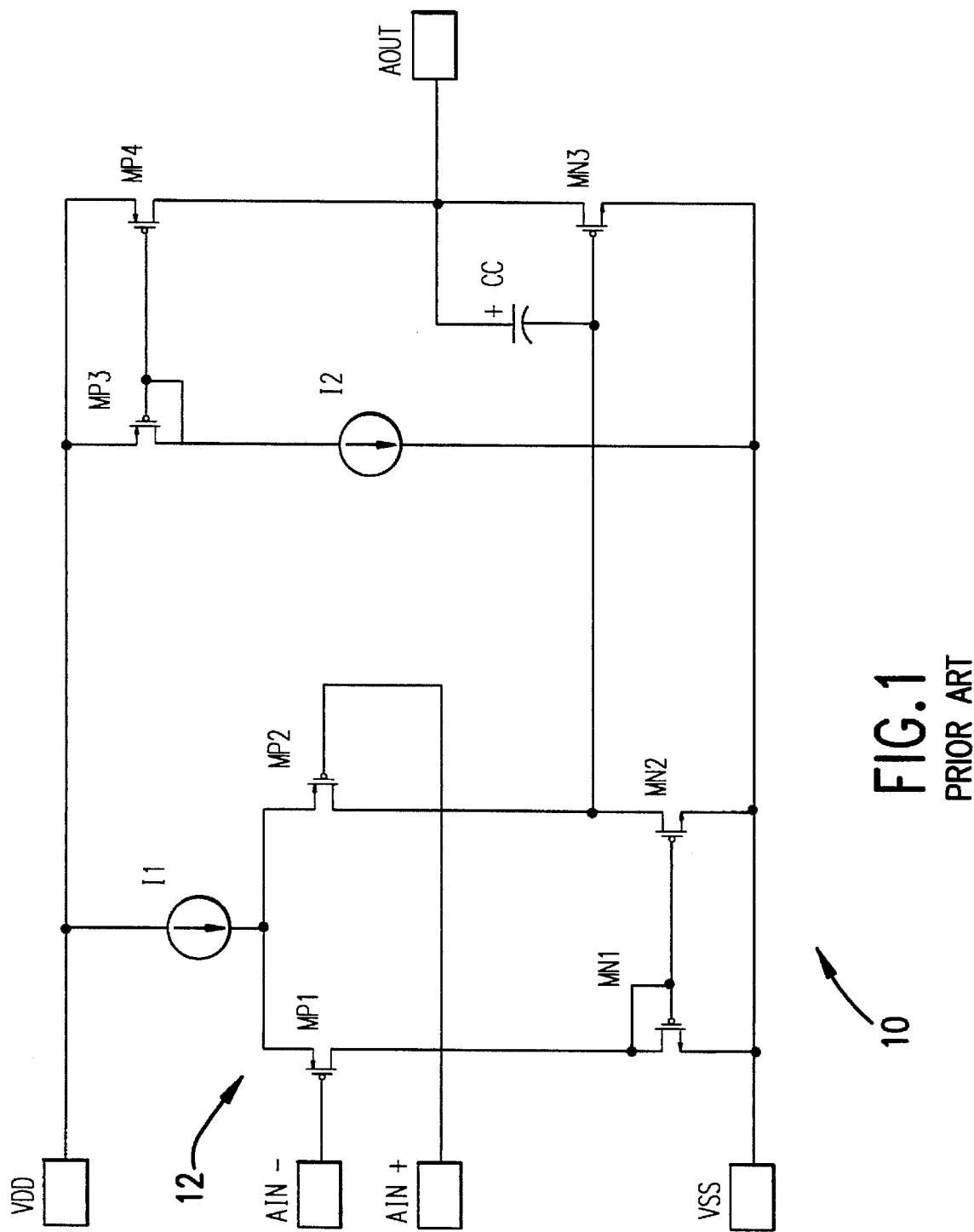
FIG. 1 is a typical prior art CMOS amplifier.
Figure 2:
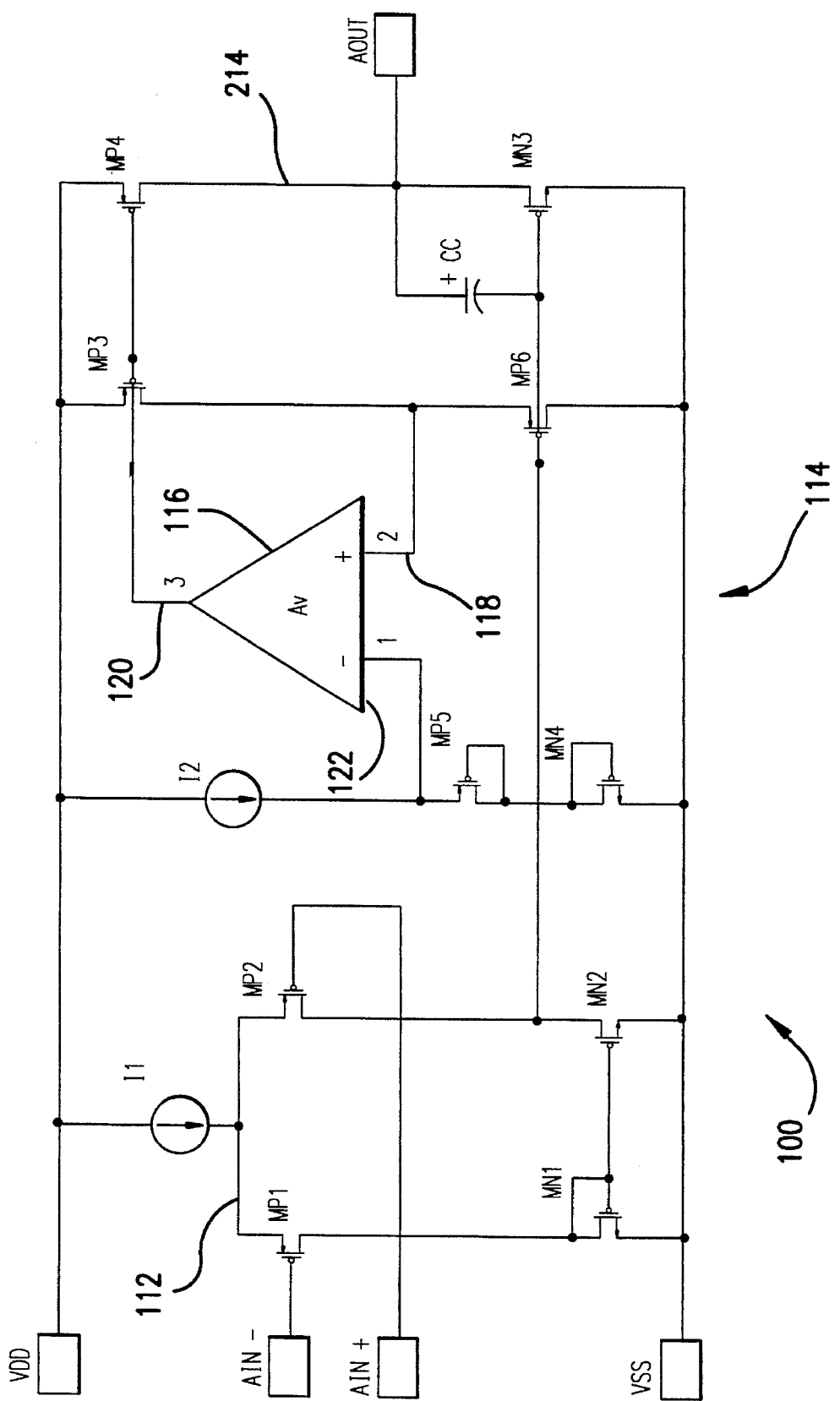
FIG. 2 is an embodiment of a CMOS amplifier according to the present invention.

FIG. 2 shows a first embodiment 100 of the invention with like components bearing like numbers. The input stage 112 having inputs AIN+ and AIN− comprises a pair of source coupled P channel transistors MP1 and MP2 coupled to a current source I1. The load of the input stage comprises diode coupled N channel transistor MN1 and transistor MN2 with the output of the input stage being taken from the drains of transistors MN2 and MP2

The output stage 114 of the embodiment 100 includes a complementary pair of source/sink transistors MN3 and MP4 along with a compensation capacitor $C_c$ coupled between the output AOUT and the gate of the directly driven output transistor MN3. Indirectly driven output transistor MP4 has its drain coupled to the output AOUT and its source coupled to the power supply VDD. The gate of the indirectly driven output transistor MP4 is coupled to the gate of a codriven feedback transistor MP3 that should preferably be the same conductivity type as the indirectly driven output transistor MP4. Transistor MP3 will mirror the current provided by indirectly codriven output transistor MP4. The drain of the feedback transistor MP3 is coupled to the source of an input stage tracking transistor MP6 that also should preferably be of the same conductivity as the indirectly driven output transistor MP4 and is directly coupled to the output drive signal from the input stage 112.

A feedback amplifier cell 116 has a noninverting input 118 coupled to the node coupling the drain of the feedback transistor MP3 to the source of the input stage tracking transistor MP6. Thus, the amplifier cell has positive feedback but due to the inverting effect of the CMOS gate provides negative feedback. The output 120 of the amplifier 116 is coupled to the gates of the feedback transistor MP3 and the output stage indirectly driven transistor MP4.

The inverting input 122 of the amplifier 116 is coupled to a reference voltage that is determined by a current source 12 and diode coupled complementary transistors MP5 and MN4. Both of these diode coupled transistors MP5 and MN4 are operated in the saturated region so that setting current 12 sets a reference voltage provided to the inverting input of the feedback amplifier 116. This voltage also sets the quiescent current of the feedback transistor MP3 and the indirectly driven output stage transistor MP4.

Operation of the circuit may be understood by considering the case where the amplifier output is supposed to be low. In that case, directly driven output transistor MN3 is on and sinking a maximum amount of current so that AOUT is as near to ground (or Vss) as is possible. In that case, the indirectly driven transistor MP4 should be sourcing a minimal amount of current and should preferably be off. This occurs because input stage tracking transistor MP6 is close to off because MP6 gate is driven to high voltage (near VDD) by input stage 112. With amplifier 116, MP4 current is forced to track MP6 current. Since MP6 is near off, MP4 will also be forced to be near off. Conversely, when the output AOUT is to be near the power supply voltage VDD, then transistor MP4 is in or near saturation and transistors MP3 and MP6 are also in or near saturation. At the same time, transistor MN3 is near and preferably in cutoff. When the input signal at the input of the input stage is near the quiescent point (i.e. AIN+≈AIN−), both transistors MP4 and MN3 are just preferably biased to be in the saturation regions of operation.

Thus, the output stage is a true source/sink stage and functions as a Class AB amplifier. Such class AB has a more efficient operation than in the prior art while still providing low distortion with virtually rail to rail excursions of the output signal. Further, given the source/sink structure, the amplifier is able to drive a low impedance load with a larger voltage swing. Such a load improves the output signal to noise ratio without a decrease in efficiency.

To optimize efficiency with a low signal to noise ratio, it is important to control the current through transistor MP4 so that when the input to the amplifier 100 is quiescent, the current is close to (but not quite at) cutoff to provide true class AB operation. This is accomplished by matching diode coupled transistor MP5 to transistor MP6 and diode coupled transistor MN4 to transistor MN3. Also, by proper area transistor ratioing of transistors MN3 and MN4, MP5 and MP6, and MP3 and MP4, the current from current source 12 can set the quiescent currents of transistors MN3 and MP4 to be minimal as will readily be apparent to those of skill in the art.

Figure 3:
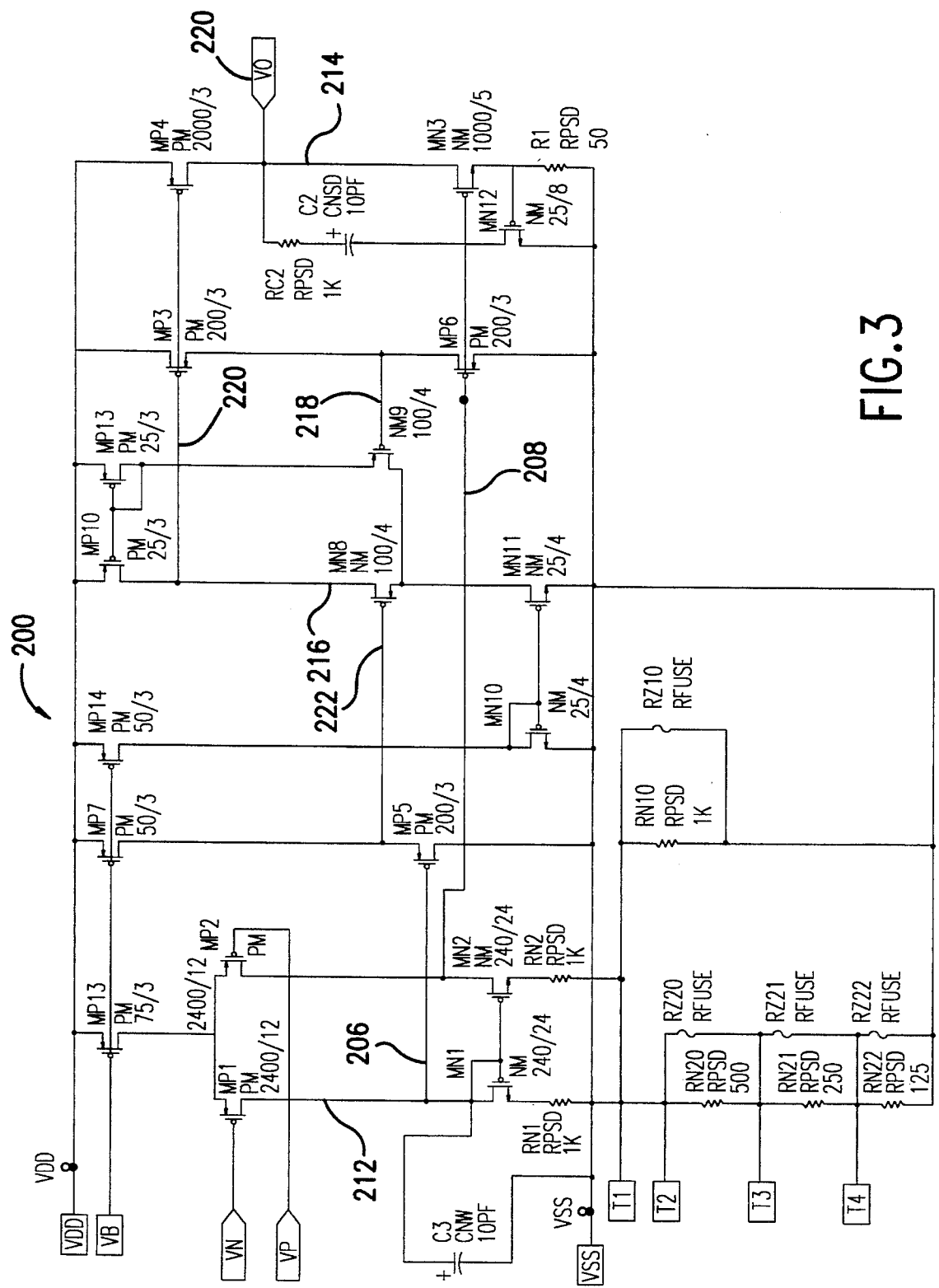
FIG. 3 is a further embodiment of a CMOS amplifier according to the present invention.

FIG. 3 shows an alternative embodiment 200 of the invention with like components bearing like numbers and the ratios indicating channel width to channel length dimensions. The node VB is a biasing point that sets various amplifier and other biasing voltages and the node VN and VP are the inverting and non-inverting inputs to the input stage 212.

Input stage 212 has a differential output, with one output 208 going to the gate of directly driven transistor MN3 in the source/sink output section 214. The other output 206 of the input stage 212 is coupled to a gate of transistor MP5, which is coupled to transistor MP7 that acts as a current source like source 12 in FIG. 2. As in FIG. 2, the source of transistor MP5 in FIG. 3 is coupled to the inverting input 222 of the feedback amplifier 216 to provide a reference voltage to transistor MP5. The output of the feedback amplifier 220 is coupled in the same manner to transistors MP3 and MP4 and the drain of transistor MP3 is coupled to the gate of transistor MN9 to provide positive feedback. Further, in this alternative embodiment of FIG. 3, transistor MN1 in the load of the input stage 212 performs the current setting functions of transistor MN4 in the embodiment 100 of FIG. 2.

Therefore, in the embodiment of FIG. 3, the quiescent current for both output transistors MP4 and MN3 is determined by current source MP7. Further, the ratios of transistor MN1 and MN3 determine the quiescent current of output transistor MN3 and the relative ratios of transistor MP5 and MP6 determine the quiescent current of transistor MP4. The dimensions of these transistors relative to each other and relative to the current supplied by the current source MP7 can be controlled to set the quiescent currents and to determine the maximum loads that are driven without clipping. Preferably, they are set to provide class AB operation.

In addition, the embodiment of FIG. 3 also has additional load resistances RN20, RN21, RN22, and RN10 in parallel with fuses RZ20, RZ21, RZ22, RZ10 on the output of the input stage 216. By selectively blowing the fuses during wafer probe, the gain of the input stage can be altered so that the output driving characteristics are symmetrical. Further, altering the load resistance also alters to a minor degree the quiescent currents at the output.

Therefore, the disclosed embodiments disclose an efficient CMOS low distortion large swing amplifier. The amplifier operates preferably as a Class AB amplifier and yet can be achieved with a simple architecture that requires only a few extra components over a conventional CMOS design. Further, the circuit provides for good frequency performance and may be readily adapted to an integrated circuit. Although several specific embodiments have been disclosed, it will be understood by those of skill in the art that the invention includes other embodiments. For example, while only a one stage input has been disclosed, it would be understood that multiple stage inputs could be used. Also, it would be understood that while the N channel transistor has been shown as the directly driven transistor, one of ordinary skill in the field would understand that the P channel output transistor could be the directly driven transistor. Nor is there any reason why the circuitry of the disclosed embodiments could be used as the output stage of a number of circuits such as a multiplier circuit, a modulator or other circuitry normally associated as having a gain. Of course, it is the claims and not the specific embodiments that are disclosed that measures the scope of the invention.

I claim:

1. A CMOS amplifier comprising:

an input stage providing at least one drive signal;

an output stage including a pair of complementary output transistors, each transistor having a conductivity type, a source, a gate and a drain, the transistors arranged in a source/sink configuration with the drain of a first transistor being coupled to the drain of the other transistor, one of the gates of one of the complementary transistors being driven by the input stage output;

a third transistor having the same conductivity type as the second of the pair of the transistors and having a gate coupled to the gate of a first of one of the pair of transistors to control said first of the pair of transistors;

a current source and a plurality of active devices coupled to each other such that the active devices are matched to the voltage drop of the first and third transistors;

an amplifier cell responsive to a signal from the input stage and to the current source and active devices such that the gate of the second of the transistors is driven by the amplifier cell; and wherein the CMOS amplifier is a Class AB amplifier.

2. The amplifier of claim 1, wherein the active devices comprise a pair of opposite conductivity transistors coupled between the current source and a reference voltage.

3. The amplifier of claim 2, wherein the active devices comprise a pair of diodes operating in the saturated region.

4. The amplifier of claim 2, wherein a fourth transistor of the same conductivity type as the second transistor is provided with the gate of the second transistor being directly coupled to the input stage through the fourth transistor and the active devices match the voltage drop across the first and fourth transistors.

5. The amplifier of claim 1, wherein the amplifier cell is coupled to have positive feedback.

6. A CMOS amplifier having an input and an output comprising:

a differential input stage responsive to the input providing a drive signal at a first node;

a pair of complementary output transistors, each transistor having a source, a drain and a gate, the complementary transistors being configured with one of the drain and the source of each transistor being coupled at an output node, whereby a source/sink output is provided;

the gate of a first transistor in the pair being coupled to be responsive only to the drive signal;

current setting means to establish the quiescent current in the second of the pair of the transistors;

a differential amplifier responsive to the input stage and to current setting means controlling the gate of second transistor such that the CMOS amplifier acts as a class AB amplifier.

7. The circuit of claim 6, wherein the input of the differential amplifier is responsive to the drive signal.

8. The circuit of claim 6, wherein the current setting means comprises a component selected from a group formed from a current source and a current sink and a pair of active devices.

9. The circuit of claim 8, wherein the input stage has as a load one of the active devices is a load in the input stage and a second of the active devices is a transistor coupled between the component and the load.

10. The circuit of claim 8, wherein the pair of active devices comprise a pair of diodes coupled in series with the one of the current source and the current sink.

11. The circuit of claim 8, wherein one of the pair of the active devices is the same conductivity as the first transistor and the other is the same conductivity as the second transistor.

12. Output stage circuitry to be driven by an input stage having a quiescent state and providing a drive signal at a node, the output stage circuitry comprising:

a pair of complementary transistors, with a first transistor having a first conductivity type and a second transistor having a second conductivity type, each transistor having dimensions and a source, a gate and a drain, the drains of the transistors being coupled together to provide a source/sink output, the gate of the first transistor being coupled to the node;

a current generator comprising either a current source or a current sink;

an amplifier cell having two inputs and an output, one of the inputs being coupled to the current generator, the gate of the second transistor being coupled to the output of the amplifier cell;

a third transistor of the same conductivity type as the second transistor and having dimensions and a gate, the third transistor sinking or sourcing most of the current of the feedback path, the gate of the third transistor also being responsive to the drive signal;

a feedback path coupled from one of the source and the drain of the third transistor to the second input of the amplifier;

at least one additional active device having dimensions and coupled to the first input of the amplifier cell;

wherein the dimensions of the first, second and third transistors and the active device are controlled relative to the current of the current source such that the pair of transistors are both barely conducting in the quiescent state and as one of the pair of transistors provides more current flow, the other of the transistors provides less current flow, with one of the transistors being normally off when the input drive signal is not in the quiescent state.

13. A CMOS output stage for a circuit having a gain, the output stage being responsive to an input signal having a quiescent state, the output stage comprising:

first and second complementary transistors each transistor having a conductivity type and a source, a drain and a gate, the gates of the two transistors being responsive to the input signal;

an output node responsive to the two complementary transistors;

a first of the two complementary transistors coupled to provide a source/sink output at the output node;

a third and fourth transistor of the same conductivity type as the second of the transistor, each of the third and fourth transistors having a source, a drain and a gate, a gate of a first of these last two transistors being responsive to the input signal and the drain of the third transistor being coupled to the drain of the fourth transistor; one of the source and the drain of the fourth transistor and one of the source and the drain of the third transistor being coupled to a feedback node; and an amplifier cell having two inputs and at least one output, the gate of the the second of the third and fourth transistors being responsive to the output of the amplifier cell, one of the inputs of the amplifier being coupled to the feedback node.

14. The CMOS output stage of claim 13, wherein the other input of the amplifier cell is responsive to the input signal.

15. A method for controlling the output stage current of a CMOS amplifier having an input stage with an output and a quiescent state and having a pair of complementary output transistors and a third transistor with each transistor having a source, a drain and a gate, the output transistors providing a source and a sink to an output node responsive to both of the complementary pair of transistors, the method comprising:

controlling the current flow of a first of the complementary transistors and the third transistor with the output of the input stage;

generating a current based upon a desired current in the second transistor when the input is in a quiescent state;

comparing the signal at a first node responsive to the generated current with a signal at a second node responsive to the current of the third transistor; and controlling the current flow of the second of the complementary transistors based upon the comparison.

16. The method of claim 15, wherein the output stage includes a fourth transistor having a source, a drain and a gate, the current flow of the fourth transistor being controlled by the comparison and one of the source and the drain of the fourth transistor being coupled to one of the source and the drain of the third transistor such that the second node is also responsive to the fourth transistor.

17. The method of claim 16, wherein the circuit further includes at least one active device coupled to be responsive to the generated current, the method further comprising setting the current of the current generator such that the generated current sets the output stage to be a class AB amplifier.

* * * * *